United States Patent
Nakazawa (10) Patent No.: US 8,975,196 B2
(45) Date of Patent: Mar. 10, 2015

(54) MANUFACTURING METHOD OF SEMICONDUCTOR DEVICE AND MANUFACTURING APPARATUS OF SEMICONDUCTOR DEVICE

(71) Applicant: Kabushiki Kaisha Toshiba, Tokyo (JP)

(72) Inventor: Keisuke Nakazawa, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 14/016,177

(22) Filed: Sep. 2, 2013

(65) Prior Publication Data

US 2014/0213038 A1 Jul. 31, 2014

(30) Foreign Application Priority Data

Jan. 31, 2013 (JP) ................................. 2013-017282

(51) Int. Cl.
*H01L 21/469* (2006.01)
*H01L 21/762* (2006.01)
*H01L 21/02* (2006.01)

(52) U.S. Cl.
CPC .... *H01L 21/76224* (2013.01); *H01L 21/02282* (2013.01)
USPC ........... 438/790; 438/424; 438/425; 438/439; 438/778; 438/782; 438/787

(58) Field of Classification Search
CPC ................... H01L 21/02282; H01L 21/76224; H01L 21/76802; H01L 21/76808; H01L 21/76822; H01L 23/5329
USPC .......... 438/424, 425, 439, 778, 782, 787, 790
See application file for complete search history.

(56) References Cited

U.S. PATENT DOCUMENTS

| | | | |
|---|---|---|---|
| 7,781,341 B2 | 8/2010 | Nakazawa | |
| 7,795,142 B2 * | 9/2010 | Masuda et al. | 438/672 |
| 2004/0072429 A1 | 4/2004 | Hieda et al. | |
| 2008/0090988 A1 | 4/2008 | Nakazawa et al. | |
| 2008/0102211 A1 | 5/2008 | Matsuo et al. | |
| 2009/0226615 A1 | 9/2009 | Nakazawa | |
| 2010/0190317 A1 | 7/2010 | Iwasawa et al. | |
| 2010/0311220 A1 | 12/2010 | Matsuo et al. | |
| 2012/0034754 A1 | 2/2012 | Iwasawa et al. | |
| 2012/0286346 A1 | 11/2012 | Nakazawa | |
| 2013/0043563 A1 | 2/2013 | Nakazawa | |
| 2013/0102124 A1 | 4/2013 | Nakazawa | |
| 2013/0115766 A1 | 5/2013 | Nakazawa | |

FOREIGN PATENT DOCUMENTS

| | | |
|---|---|---|
| JP | 2010016046 A | 1/2010 |
| JP | 4621613 | 1/2011 |
| JP | 4625249 B2 | 2/2011 |

* cited by examiner

*Primary Examiner* — Bac Au
(74) *Attorney, Agent, or Firm* — Patterson & Sheridan, LLP (57) ABSTRACT

According to one embodiment, a method of manufacturing a semiconductor device includes providing a substrate, supplying a first liquid including a terpene to a surface of the substrate, supplying a second liquid including a silicon-containing compound to the surface of the substrate, and converting the silicon-containing compound to a silicon oxide compound.

20 Claims, 6 Drawing Sheets

MANUFACTURING METHOD OF SEMICONDUCTOR DEVICE AND MANUFACTURING APPARATUS OF SEMICONDUCTOR DEVICE

CROSS-REFERENCE TO RELATED APPLICATION

This application is based upon and claims the benefit of priority from Japanese Patent Application No. 2013-017282, filed Jan. 31, 2013, the entire contents of which are incorporated herein by reference.

FIELD

Embodiments described herein relate generally to a manufacturing method of a semiconductor device and an apparatus for manufacturing a semiconductor device.

BACKGROUND

With shrinking of semiconductor devices, it becomes important to accurately form an insulating film on the surface of a substrate. For example, formation of an insulating film in a narrow groove (trench) is an important step in the device fabrication process.

However, it becomes more difficult to accurately form a satisfactory insulating film on the surface of a substrate as shrinking of semiconductor devices advances and device feature sizes become smaller.

DETAILED DESCRIPTION

According to embodiments of the present disclosure, there is provided a manufacturing method of a semiconductor device and an apparatus capable of forming an insulating film on the surface of a substrate of semiconductor device.

In general, according to one embodiment, a manufacturing method of a semiconductor device includes: providing a substrate, supplying a first liquid including a terpene compounds to a surface of the substrate and supplying a second liquid including a silicon-containing compound to the surface of the substrate. The second liquid then mixes and/or exchanges with the first liquid on the substrate and subsequent processing converts the silicon-containing compound to an insulating material, such as silicon oxide.

Hereinafter, embodiments will be described with reference to the drawings.

(First Embodiment)

Referring to FIGS. 1 to 5, an example of a manufacturing method of a semiconductor device according to a first embodiment will be described. This embodiment relates to a method for forming an insulating film in a device isolation groove (trench) for Shallow Trench Isolation (STI) device structures.

Figure 1:
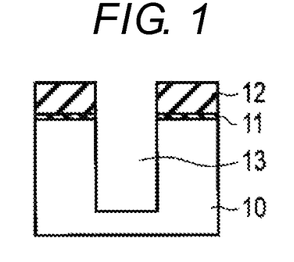
FIG. 1-FIG. 5 are example cross-sectional views showing steps of a manufacturing method of a semiconductor device according to a first embodiment.

First, a process shown in FIG. 1 is performed in which a silicon oxide film 11 with a thickness of about 10 nm is formed on the surface of a semiconductor substrate (silicon substrate) 10 by thermal oxidation. Then, a silicon nitride film with a thickness of about 200 nm is formed as a stopper film 12 (a stop film for Chemical Mechanical Polishing (CMP)) by a low pressure Chemical Vapor Deposition (CVD) method, for example. The film thicknesses can be changed as appropriate to process conditions, and the thickness of the stopper film 12 is set so as to range from about 100 nm to about 300 nm in this example.

Next, a device isolation groove 13 for STI is formed in the stopper film 12, the silicon oxide film 11, and the semiconductor substrate 10 by using photolithography and dry etching, for example. The width and the depth of the device isolation groove 13 can be appropriately changed within available process parameters. The width is set so as to range from about 15 nm to about 10 μm, and the depth is set so as to range from about 200 nm to about 500 nm in this example.

Figure 2:
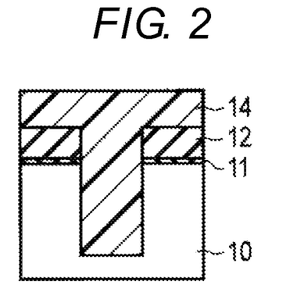

Next, a process shown in FIG. 2 is performed. In this process, α-pinene liquid, for example, is supplied as first liquid including one or more terpene compounds to the surface of the substrate after the process in FIG. 1, and the surface is treated (moistened) with the α-pinene liquid. Specifically, the α-pinene liquid is dripped to the center of the substrate to be treated, and spin coating is performed. Here, the rotation rate of the spin coating is from 1000 rpm to 3000 rpm, and the rotation time is from about 0.1 seconds to about 1 second. The dripping amount of the α-pinene liquid is about 3 ml, for example. The spin coating process leaves the surface of the substrate covered with an α-pinene liquid layer 14, and the device isolation groove 13 is filled with the α-pinene liquid layer 14, as shown in FIG. 2. It is not necessary to completely fill the entire device isolation groove 13 with the α-pinene liquid layer 14, but in this example the device isolation groove is filled with liquid layer 14.

Figure 3:
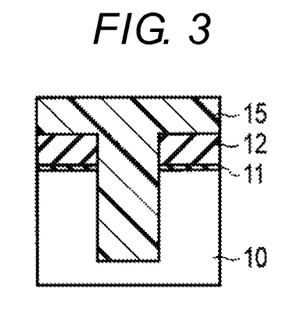

Next, a process shown in FIG. 3 is performed. In this next process, a polysilazane solution (second liquid including a silicon-containing compound) is supplied to the surface of the substrate. The α-pinene liquid (liquid layer 14) is replaced with the polysilazane solution. Specifically, the polysilazane solution is dripped to the center of the substrate and spin coating is performed.

The polysilazane solution is an example of silicon-containing compounds. Other silicon-containing compounds may be used instead of or in addition to polysilazane. In addition, the polysilazane solution may include solvent components such as, for example, xylene or di-n-butyl ether.

The polysilazane solution is preferably supplied before the α-pinene solution dries. Since the polysilazane solution is supplied before the α-pinene solution completely dries, it is preferable to perform the process of supplying the polysilazane solution relatively soon after the process of supplying the α-pinene solution.

The rotation rate of the spin coating of the polysilazane solution is from 1000 rpm to 2500 rpm, for example, and the supplied amount of the polysilazane solution is from about 1 ml to 2 ml, for example.

By supplying the polysilazane solution to the surface of the substrate, the α-pinene liquid is gradually replaced with the polysilazane solution, and the α-pinene liquid is substantially completely replaced with the polysilazane solution. Thereafter, the rotation of the substrate to be treated is continued for about fifteen seconds at such a rotation rate that a final film thickness can be achieved.

By the aforementioned process, the surface of the substrate is covered with a coated film (polysilazane coated film 15) containing polysilazane, and the device isolation groove 13 is filled with the polysilazane coated film 15.

After spin coating the initial layer additional process steps such as back rinse of the rear surface of the semiconductor substrate 10, edge cutting (edge bead removal), and the like are performed.

Thereafter, baking at 150° C. for about 3 minutes is performed to evaporate remaining solvent in the polysilazane coated film 15. A perhydropolysilazane film (PHPS film) is thus obtained in this example embodiment.

Figure 4:
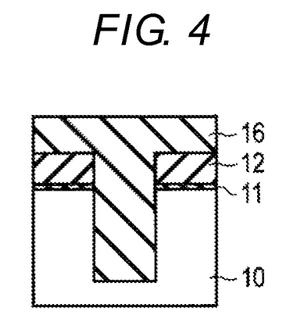

Next, a process shown in FIG. 4 is performed. In this process, oxidation treatment is performed in an oxidizing atmosphere containing water vapor to transform the PHPS film to a silicon oxide film. That is, nitrogen (N) in Si—N coupling in the PHPS film is replaced with oxygen (O) through the oxidation treatment, and the silicon oxide film is obtained. The temperature of the oxidation treatment is preferably from 230° C. to 900° C. If the oxidation treatment is performed at a temperature which is lower than 230° C., a porous silicon oxide film may be formed. If the oxidation treatment is performed at a temperature which is higher than 900° C., the side surface of the device isolation groove 13 is oxidized to an excessive thickness.

The oxidation treatment time is preferably equal to or more than five minutes in order to stabilize the oxidation atmosphere and the oxidation temperature. In addition, the oxidation treatment time is preferably equal to or less than sixty minutes in order to prevent the side surface of the device isolation groove 13 from being oxidized to an excessive thickness. By the oxidation treatment, the surface of the substrate to be treated is covered with a silicon oxide film 16, and the device isolation groove 13 is filled with the silicon oxide film 16 as shown in FIG. 4.

Figure 5:
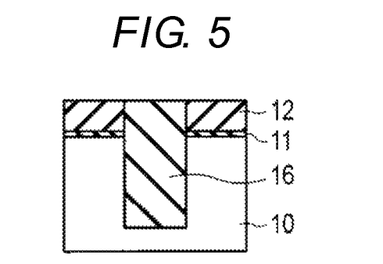

Next, a process shown in FIG. 5 is performed. In this process, the silicon oxide film 16 on the stopper film (silicon nitride film) 12 is removed by CMP or the like, and the silicon oxide film 16 is left in the device isolation groove 13.

Thereafter, thermal treatment is performed in an inert gas atmosphere at about 700° C. to 1100° C. to densify the silicon oxide film 16. It may be difficult to sufficiently densify the silicon oxide film 16 at a temperature which is lower than 700° C. The depth of a channel layer which was formed by ion implantation becomes excessively deep if the temperature is set to be higher than 1100° C. The thermal treatment time is from about 1 second to 120 minutes. In addition, the thermal treatment may be performed before or after the CMP treatment.

As described above, a STI type device isolation insulating film as shown in FIG. 5 is formed. Thereafter, the semiconductor device (semiconductor integrated circuit device) is completed by performing a predetermined process.

For use as a first liquid, α-pinene has excellent wetability against silicon substrates. In addition, α-pinene mixes well with the polysilazane solution. That is, polysilazane is easily dissolved in α-pinene, and the solvent (xylene, di-n-butyl ether, or the like) in the polysilazane solution is easily mixed with α-pinene. In addition, the vapor pressure of α-pinene is as low as about 3 hPa to about 5.2 hPa at 23° C. In addition, α-pinene has lower viscosity than that of the polysilazane solution. Therefore, by supplying the α-pinene liquid to the surface of the substrate before coating the substrate with the polysilazane solution, it is possible to easily replace the α-pinene solution with the polysilazane solution and reliably fill the minute device isolation groove with the polysilazane coated film. In addition, the amount of air bubbles contained in the polysilazane coated film can be significantly reduced. As a result, it is possible to form a silicon oxide film with less defects, uniform film density, and high quality in the device isolation groove. In addition, it is possible by pre-treating the substrate with α-pinene to form a satisfactory polysilazane coated film using only a small amount of polysilazane solution. That is, it is possible to effectively fill the narrow device isolation groove 13 with the polysilazane coated film if the substrate is treated with α-pinene. As a result, it is possible to reduce the wasted amount of polysilazane and thereby reduce manufacturing costs of the semiconductor device.

In addition, α-pinene is a plant-based natural material, and is not thought to be significantly toxic to humans. In addition, it is possible to contribute to reduction of carbon-dioxide emission by using the plant-based natural material.

Figure 6:
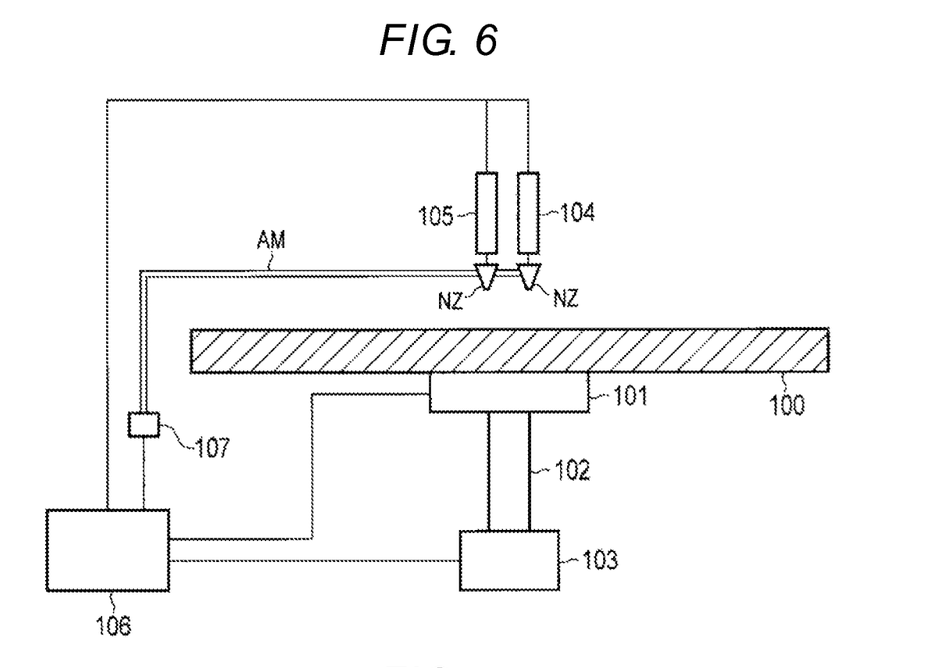
FIG. 6 is an example of a view showing a configuration of a manufacturing apparatus of a semiconductor device according to the first embodiment.

FIG. 6 is an example of a diagram schematically showing a configuration of a manufacturing apparatus of the semiconductor device according to an embodiment.

As shown in FIG. 6, a substrate to be treated 100 is supported (held) by a supporting unit 101. A rotation axis 102 is connected to the supporting unit 101, and the substrate to be treated 100 which is supported by the supporting unit 101 rotates by rotating the rotation axis 102 by a drive unit (motor) 103. A first liquid supply unit 104 and a second liquid supply unit 105 are arranged above the supporting unit 101. The first liquid supply unit 104 is for supplying the first liquid (e.g., α-pinene) to the surface of the substrate to be treated 100 which is supported by the supporting unit 101, and the second liquid supply unit 105 is for supplying the second liquid (e.g., polysilazane solution) to the surface of the substrate to be treated 100 to which the first liquid (e.g., α-pinene liquid) was supplied. The first liquid supply unit 104 and the second liquid supply unit 105 are provided with nozzles NZ for supplying the liquid to the substrate 100. The respective nozzles NZ are supported by an arm AM. For supplying the respective liquid to the substrate 100, a moving mechanism 107 which causes the arm AM to move to the center of the substrate 100 and supply the liquid is provided. Control of the entire apparatus (e.g., sequence control) such as control for causing the supporting unit 101 to support the substrate to be treated 100, drive control (rotation control) by the drive unit 103, first liquid supply control by the first liquid supply unit 104 and arm movement control, and second liquid supply control by the second liquid supply unit 105 and arm movement control are performed by a control unit 106.

By using this apparatus, it is possible to consecutively supply the α-pinene liquid and the polysilazane solution to the substrate. As a result, it is possible to rapidly replace the α-pinene liquid with the polysilazane solution.

(Second Embodiment)

Referring to FIGS. 7 to 12, an example of a manufacturing method of a semiconductor device according to a second embodiment will be described. In this embodiment, a method for forming the insulating film according to the first embodiment is applied to a process for manufacturing a NAND type nonvolatile memory. In addition, the description which is already made in the first embodiment will be omitted. Moreover, it is possible to use the apparatus shown in FIG. 6 according to the first embodiment as an apparatus for supplying the α-pinene liquid and the polysilazane solution.

Figure 7:
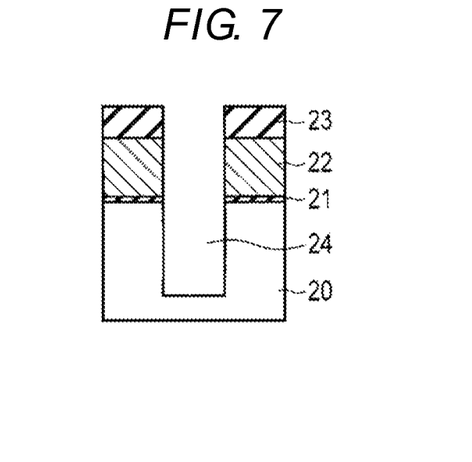
FIG. 7-FIG. 12 are example cross-sectional views showing steps of a manufacturing method of a semiconductor device according to a second embodiment.

First, a process shown in FIG. 7 is performed. First, a silicon oxide film (thickness of 8 nm or less) is formed as a gate insulating film (tunnel insulating film) 21 on the surface of a semiconductor substrate (silicon substrate) 20 by thermal oxidation in this process. Then, a polysilicon film (thickness of about 100 nm) is formed as a floating gate electrode film 22 on the surface of the gate insulating film 21. It is also possible to use a WSi film or a CoSi film as the floating gate electrode film 22. The film thickness in this case is from about 100 nm to about 200 nm. Then, a silicon nitride film with a thickness of about 200 nm is formed as a stopper film 23 of the CMP on the floating gate electrode film 22 by the low pressure CVD method. It is also possible to use a polysilicon film (thickness of about 100 nm to 200 nm) as the stopper film 23.

Next, a device isolation groove 24 for STI is formed in the stopper film 23, the floating gate electrode film 22, the gate insulating film 21, and the semiconductor substrate 20 by using photolithography and dry etching. The width and the depth of the device isolation groove 24 can be appropriately changed. Here, the width is from about 15 nm to 10 µm, and the depth is from about 200 nm to 500 nm in this example.

Figure 8:
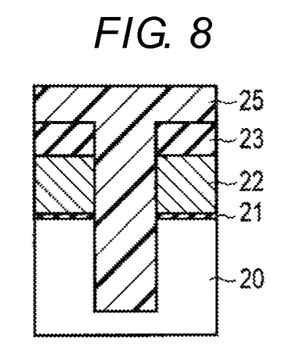

Next, a process shown in FIG. 8 is performed. In this process, the α-pinene liquid, for example, is supplied to the surface of the substrate obtained by the process in FIG. 7, and the surface of the substrate to be treated is moistened (wetted) with the α-pinene liquid. The specific method and conditions can be the same as those in the first embodiment. In doing so, the surface of the substrate to be treated is covered with an α-pinene liquid layer 25, and the device isolation groove 24 is filled with the α-pinene liquid layer 25.

Figure 9:
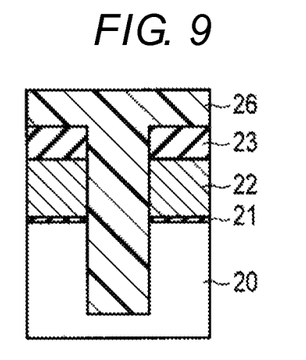

Next, a process shown in FIG. 9 is performed. In this process, the polysilazane solution is supplied to the surface of the substrate to which the α-pinene liquid was supplied, and the α-pinene liquid is replaced with the polysilazane solution. The specific method and conditions can be the same as those in the first embodiment. In doing so, the α-pinene liquid is gradually replaced with the polysilazane solution in the same manner as in the first embodiment. As a result, a polysilazane coated film 26 is obtained in the same manner as in the first embodiment. Specifically, the surface of the substrate is covered with the polysilazane coated film 26, and the device isolation groove 24 is filled with the polysilazane coated film 26. A back rinse of the rear surface of the semiconductor substrate 20 and edge cutting are also performed, if required. Thereafter, baking is performed in the same manner as in the first embodiment to evaporate the solvent in the polysilazane coated film 26. As described above, a PHPS film is obtained.

Figure 10:
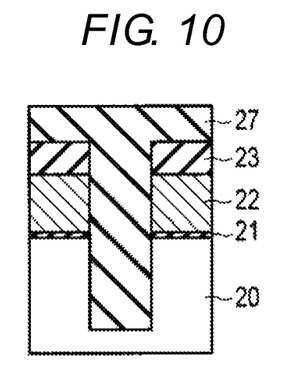

Next, a process shown in FIG. 10 is performed. In this process, an oxidation treatment is performed in an oxidation atmosphere containing water vapor to transform the PHPS film to a silicon oxide film. A specific method and conditions for the oxidation treatment are the same as those in the first embodiment. By the oxidation treatment, the surface of the substrate to be treated is covered with a silicon oxide film 27, and the device isolation groove 24 is filled with the silicon oxide film 27 as shown in FIG. 10.

Figure 11:
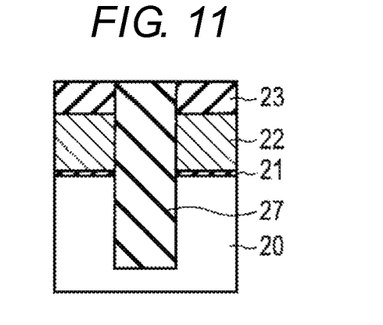

Next, a process shown in FIG. 11 is performed. In this process, the silicon oxide film 27 on the stopper film (silicon nitride film) 23 is removed by CMP or the like, and the silicon oxide film 27 is left in the device isolation groove 24. Thereafter, thermal treatment is performed in an inert gas atmosphere at about 700° C. to about 1100° C. to densify the silicon oxide film 27. The thermal treatment time is from about 1 second to 120 minutes.

Figure 12:
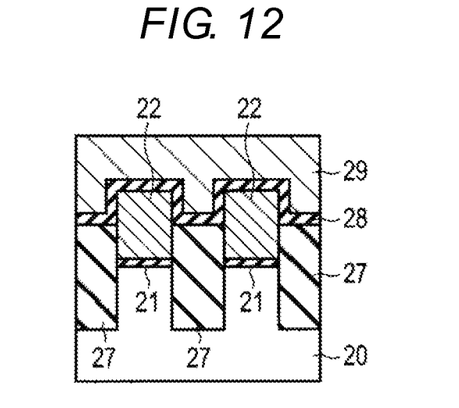

Next, a process shown in FIG. 12 is performed. In this process, the stopper film 23 is removed by etching with the use of phosphoric acid solution, for example. Then, an upper part of the silicon oxide film 27 is removed by etching with the use of diluted hydrofluoric acid, for example. In doing so, an upper part of the floating gate electrode film 22 is exposed at a length of about 100 nm. Since the silicon oxide film 27 with high quality is formed in the device isolation groove 24, it is possible to uniformly etch the silicon oxide film 27 with high controllability.

Next, an inter-electrode insulating film 28 is formed in the upper surface of the silicon oxide film (device isolation insulating film) 27 and the exposed surface of the floating gate electrode film 22. A laminated film (total film thickness of about 20 nm) which is configured of a silicon oxide film, a silicon nitride film, and a silicon oxide film and is formed by the CVD method, for example, is used as the inter-electrode insulating film 28. Furthermore, a control gate electrode film 29 is formed on the inter-electrode insulating film 28. A laminated film (total film thickness of about 50 nm) which is configured of a polysilicon film and a tungsten film and is formed by the CVD method, for example, is used as the control gate electrode film 29.

Thereafter, the semiconductor device (NAND type non-volatile memory device) is completed by performing a predetermined process.

It is possible to achieve the same effect as that in the first embodiment. That is, by supplying a α-pinene liquid to the surface of the substrate before coating the substrate with the polysilazane solution, it is possible to form a silicon oxide film with less defects and higher quality in the device isolation groove by using only a small amount of polysilazane solution.

(Third Embodiment)

Referring to FIGS. 13 to 18, an example of a manufacturing method of a semiconductor device according to a third embodiment will be described. In this embodiment, the method for forming the insulating film as described in the first embodiment is applied to a Pre-Metal Dielectric (PMD) manufacturing process in which an insulating film is formed before a process for forming metal wire. In addition, description which is already made in the first embodiment will be omitted. Moreover, it is possible to use the apparatus shown in FIG. 6 according to the first embodiment as an apparatus for supplying the α-pinene liquid and the polysilazane solution.

Figure 13:
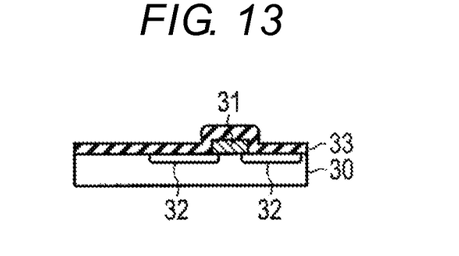
FIG. 13-FIG. 18 are example cross-sectional views showing steps of a manufacturing method of a semiconductor device according to a third embodiment.

First, a process shown in FIG. 13 is performed. First, an MOS transistor including a gate electrode 31, a gate insulating film (not shown), and an impurity diffusion layer 32 which functions as a source and a drain is formed on a semiconductor substrate (e.g., a silicon substrate) 30 in this process. Then, an inter-layer insulating film 33 is formed on the semiconductor substrate in which the MOS transistor was formed.

Figure 14:
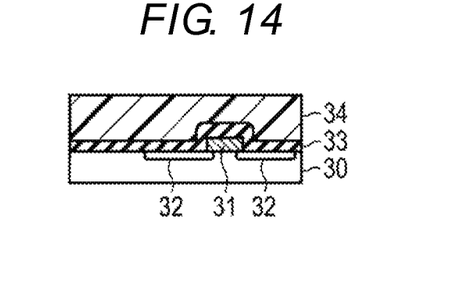

Next, a process shown in FIG. 14 is performed. In this process, the α-pinene liquid, for example, is supplied to the surface of the substrate obtained after the process in FIG. 13, namely the surface of the inter-layer insulating film 33 is wetted (moistened) with the α-pinene liquid. The specific method and conditions can be the same as those in the first embodiment. In doing so, the surface of the substrate to be treated, namely the surface of the inter-layer insulating film 33 is covered with an α-pinene liquid layer 34.

Figure 15:
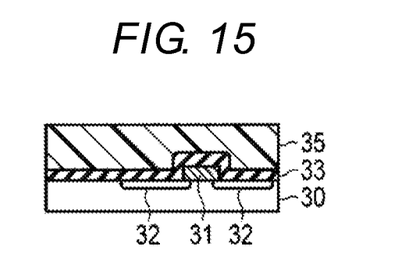

Next, a process shown in FIG. 15 is performed. In this process, the polysilazane solution is supplied to the surface of the substrate to which the α-pinene liquid was supplied, and the α-pinene liquid is replaced with the polysilazane solution. The specific method and conditions can be the same as those in the first embodiment. In doing so, the α-pinene liquid is gradually replaced with the polysilazane solution in the same manner as in the first embodiment. As a result, a polysilazane film 35 is obtained in the same manner as in the first embodiment. Specifically, the surface of the substrate, namely the surface of the inter-layer insulating film 33 is coated with the polysilazane film 35. Additional steps such as back rinse of the rear surface of the semiconductor substrate 30 and the edge cutting (edge bead removal) are performed, if required. Thereafter, baking is performed, which may be in the same manner as in the first embodiment, to evaporate the solvent in the polysilazane film 35. As described above, a PHPS film is obtained.

Figure 16:
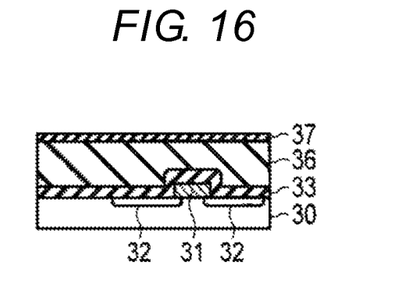

Next, a process shown in FIG. 16 is performed. In this process, oxidation treatment is performed in an oxidation atmosphere containing water vapor to transform the PHPS film to a silicon oxide film. The specific method and conditions for the oxidation treatment can be the same as those in the first embodiment, but may be varied as appropriate. By the oxidation treatment, the surface of the substrate, namely the surface of the inter-layer insulating film 33 is covered with a silicon oxide film 36 as shown in FIG. 16. In addition, the oxidation treatment is preferably performed at such a temperature that the gate electrode 31 is not oxidized, for example, at a temperature which is equal to or less than 600° C. Annealing may be performed in an inert gas atmosphere after the oxidation treatment. Optionally, CMP may be performed after the oxidation treatment (or the annealing treatment in the inert gas atmosphere) in order to flatten the silicon oxide film 36. In addition, it is also possible to omit the flattening treatment by the CMP by adjusting the polysilazane solution so as to obtain desired flatness.

Next, a silicon nitride film 37 is formed as an etching stopper film on the silicon oxide film 36. The silicon nitride film 37 is formed to have a thickness of about 200 nm by the CVD method, for example.

Figure 17:
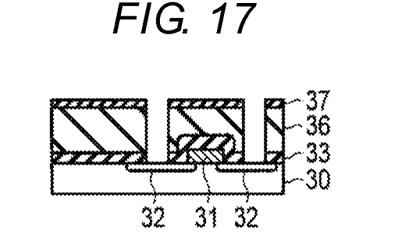

Next, a process shown in FIG. 17 is performed. In this process, a contact hole is formed in the silicon nitride film 37, the silicon oxide film 36, and the inter-layer insulating film 33 by using photolithography and Reactive Ion Etching (RIE), for example.

Figure 18:
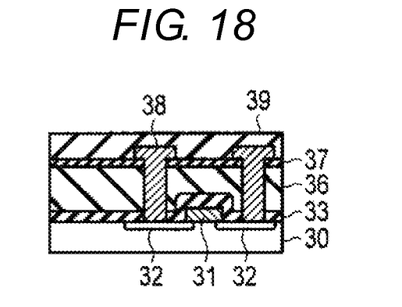

Next, a process shown in FIG. 18 is performed. In this process, metal wire 38 is formed in the contact hole and on the silicon nitride film 37. Furthermore, an inter-layer insulating film 39 is formed on the entire surface.

Thereafter, the semiconductor device is completed by performing a predetermined process.

Even in this embodiment, it is possible to achieve the same effect as that in the first embodiment. That is, by supplying the α-pinene liquid to the surface of the substrate before coating the substrate to be treated with the polysilazane solution, it is possible to form an insulating film (silicon oxide film) with high quality by using only a small amount of polysilazane solution.

(Fourth Embodiment)

Referring to FIGS. 19 to 22, an example of a manufacturing method of a semiconductor device according to a fourth embodiment will be described. In this embodiment, the method for forming an insulating film as described in the first embodiment is applied to an Inter-Metal Dielectric (IMD) manufacturing process for forming an insulating film between processes for forming metal wire. In addition, the description which is already made in the first embodiment will be omitted. Moreover, it is possible to use the apparatus shown in FIG. 6 according to the first embodiment as an apparatus for supplying the α-pinene liquid and the polysilazane solution.

Figure 19:
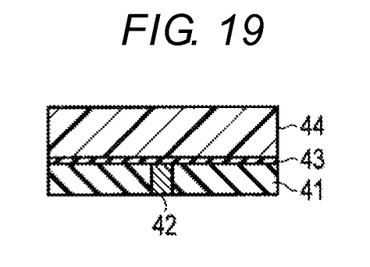
FIG. 19-FIG. 22 are example cross-sectional views showing steps of a manufacturing method of a semiconductor device according to a fourth embodiment.

First, a process shown in FIG. 19 is performed. First, metal wire (a tungsten metal wire, for example) 42 is formed in an insulating film 41 which is formed on a semiconductor substrate (not shown) in this process. Then, a silicon nitride film 43 is formed on the insulating film 41 and the metal wire 42.

Next, the α-pinene liquid, for example, is supplied to the surface of the substrate obtained as described above, namely the surface of the silicon nitride film 43 is wetted (moistened) with the α-pinene liquid. The specific method and conditions can be the same as those in the first embodiment, but may be varied as appropriate. As described above, the surface of the substrate, namely the surface of the silicon nitride film 43 is covered with an α-pinene liquid layer 44.

Figure 20:
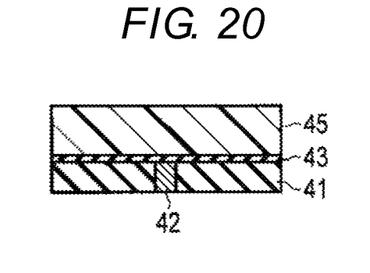

Next, a process shown in FIG. 20 is performed. In this process, the polysilazane solution is supplied to the surface of the substrate to which the α-pinene liquid was supplied, and the α-pinene liquid is replaced with the polysilazane solution. The specific method and conditions can be the same as those in the first embodiment, but may be varied as appropriate. In doing so, the α-pinene liquid is gradually replaced with the polysilazane solution in the same manner as in the first embodiment. As a result, a polysilazane coated film 45 is obtained in the same manner as in the first embodiment. Specifically, the surface of the substrate to be treated, namely the surface of the silicon nitride film 43 is covered with the polysilazane coated film 45. Additional process steps such as back rinse and edge cutting are performed if required. Thereafter, baking can be performed in the same manner as in the first embodiment to evaporate the solvent in the polysilazane coated film 45. As described above, a PHPS film is obtained.

Figure 21:
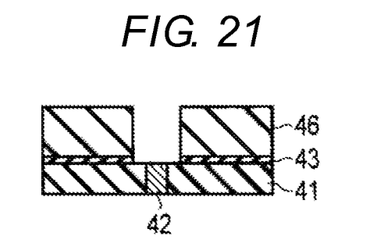

Next, a process shown in FIG. 21 is performed. In this process, oxidation treatment is performed in an oxidation atmosphere containing water vapor to transform the PHPS film to a silicon oxide film. The specific method and conditions for the oxidation treatment can be the same as those in the first embodiment, but may be varied as appropriate.

By the oxidation treatment, the surface of the substrate, namely the surface of the silicon nitride film 43 is covered with a silicon oxide film 46 as shown in FIG. 21. In addition, the oxidation treatment is preferably performed at such a temperature that the properties of wire 42 are not adversely affected.

Next, a contact hole is formed in the silicon oxide film 46 and the silicon nitride film 43 by using photolithography and RIE so as to expose the metal wire 42.

Figure 22:
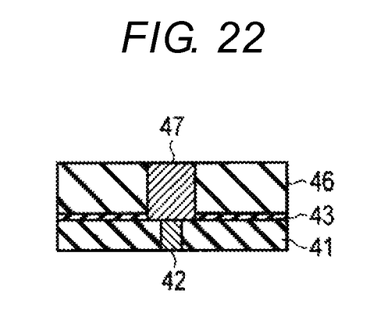

Next, a process shown in FIG. 22 is performed. In this process, metal wire (Al wire, for example) 47 is formed in the contact hole which is formed by the process in FIG. 21. In doing so, the metal wire 47 is connected to the metal wire 42.

Thereafter, the semiconductor device is completed by performing a predetermined process.

It is possible to achieve the same effect as that in the first embodiment. That is, by supplying the α-pinene liquid to the surface of the substrate before coating the substrate with the polysilazane solution, it is possible to form an insulating film (silicon oxide film) with high quality by using only a small amount of polysilazane solution.

Although the first to fourth embodiments are described above as specific examples, the following modifications can be made in the first to fourth embodiments.

Although α-pinene was used as the first liquid containing terpenes in the first to fourth embodiments, β-pinene, p-menthane, d-limonene, dipentene, or 1, 8-cineol may be used as terpenes instead of α-pinene. The first liquid containing terpenes may also comprise mixtures of α-pinene, β-pinene, p-menthane, d-limonene, dipentene, and 1, 8-cineol . It is possible to achieve the same effect as that in the first to fourth embodiments even if such terpenes are used. In addition, there is an advantage that edge cutting can be easily performed especially when α-pinene is used.

In addition, although PHPS which was configured only of silicon (Si), hydrogen (H), and nitrogen (N) was used as polysilazane in the first to fourth embodiments, polysilazane in which hydrogen in PHPS is substituted with a functional group such as a methoxy group ($CH_3O$) may be used.

In addition, polysiloxane instead of polysilazane may be used as a compound containing silicon. If polysiloxane is used, it is possible to use propyleneglycol monomethyl ether (PGME), propylene glycol monomethyl ether acetate (PG-MEA), low molecular weight siloxane, or the like as solvent.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
   providing a substrate;
   supplying a first liquid including a terpene to a surface of the substrate;
   supplying a second liquid including a silicon-containing compound to the surface of the substrate after the first liquid has been supplied to the surface of the substrate to displace the first liquid with the second liquid.

2. The method of claim 1, wherein the terpene is one of α-pinene, β-pinene, p-menthane, d-limonene, dipentene, and 1,8-cineol.

3. The method of claim 1, wherein the silicon-containing compound is one of polysilazane and polysiloxane.

4. The method of claim 1, wherein a trench is formed in the surface of the substrate before the step of supplying the first liquid.

5. The method of claim 1, wherein the first liquid includes two or more terpenes.

6. The method of claim 1, wherein the second liquid includes a solvent.

7. The method of claim 6, wherein the solvent is one of xylene and di-n-butyl ether.

8. The method of claim 1, further comprising spin coating the first liquid on the substrate.

9. The method of claim 1, further comprising spin coating the second liquid on the substrate.

10. The method of claim 1, further comprising heating the substrate after supplying the second liquid to evaporate solvent from the second liquid.

11. The method of claim 1, wherein converting the silicon-containing compound to the silicon oxide compound is performed in an atmosphere containing water vapor.

12. A method of manufacturing a semiconductor device, comprising:
   providing a semiconductor substrate having a silicon oxide film and a silicon nitride film disposed thereon;
   forming a trench that extends through the silicon oxide film and the silicon nitride film into the semiconductor substrate;
   supplying a first liquid including a terpene to a surface of the semiconductor substrate so as to at least partially fill the trench; and
   supplying a second liquid including a silicon-containing compound to the surface of the semiconductor substrate to at least partially displace the first liquid with the second liquid.

13. The method of claim 12, further comprising:
   converting the silicon-containing compound to a silicon oxide compound; and
   removing the silicon oxide compound that is located above the silicon nitride film by using a chemical mechanical polishing process.

14. The method of claim 13, wherein the trench is a shallow trench isolation feature.

15. The method of claim 12, wherein the terpene is one of α-pinene, β-pinene, p-menthane, d-limonene, dipentene, and 1,8-cineol, and
   the silicon-containing compound is one of polysilazane and polysiloxane.

16. The method of claim 12, wherein the semiconductor substrate has a floating gate electrode film and a gate insulating film disposed between the silicon nitride film and the silicon oxide film.

17. A manufacturing apparatus of a semiconductor device, comprising:
   a supporting unit supporting a substrate to be treated;
   a first liquid supply unit supplying first liquid containing a terpene to a surface of the substrate to be treated supported by the supporting unit;
   a second liquid supply unit supplying second liquid containing a silicon-containing compound to the surface of the substrate to be treated to which the first liquid has been supplied; and
   a control unit configured to control the first liquid supply unit and the second liquid supply unit such that the first liquid and the second liquid are supplied to the substrate to be treated.

18. The manufacturing apparatus of a semiconductor device according to claim 17, wherein the control unit is configured to control the first and second liquid supply units such that the second liquid is supplied to the surface of the substrate after the first liquid has been supplied to the surface of the substrate.

19. The manufacturing apparatus of claim 17, wherein the terpene is one of α-pinene, β-pinene, p-menthane, d-limonene, dipentene, and 1,8-cineol.

20. The manufacturing apparatus of claim 17, wherein the silicon-containing compound is one of polysilazane and polysiloxane.

* * * * *